United States Patent
Hino et al.

(10) Patent No.: US 12,476,190 B2
(45) Date of Patent: Nov. 18, 2025

(54) SEMICONDUCTOR DEVICE, POWER CONVERTER, METHOD FOR MANUFACTURING SEMICONDUCTOR DEVICE, AND METHOD FOR MANUFACTURING POWER CONVERTER

(71) Applicant: Mitsubishi Electric Corporation, Tokyo (JP)

(72) Inventors: Yasunari Hino, Tokyo (JP); Yo Tanaka, Tokyo (JP); Masao Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 515 days.

(21) Appl. No.: 17/494,128

(22) Filed: Oct. 5, 2021

(65) Prior Publication Data

US 2022/0028794 A1    Jan. 27, 2022

Related U.S. Application Data

(62) Division of application No. 16/443,350, filed on Jun. 17, 2019, now Pat. No. 11,183,457.

(30) Foreign Application Priority Data

Jul. 23, 2018   (JP) ................. 2018-137588

(51) Int. Cl.
*H01L 23/532*   (2006.01)
*H01L 23/00*    (2006.01)
(Continued)

(52) U.S. Cl.
CPC .... *H01L 23/53228* (2013.01); *H01L 23/3128* (2013.01); *H01L 23/49* (2013.01);
(Continued)

(58) Field of Classification Search
CPC ........... H01L 23/53228; H01L 23/3128; H01L 23/49; H01L 23/49562; H01L 23/49575;
(Continued)

(56) References Cited

U.S. PATENT DOCUMENTS 9,949,385 B2   4/2018 Hartmann et al.
10,090,276 B2  10/2018 Hashimoto
(Continued)

FOREIGN PATENT DOCUMENTS

DE         101 03 084 A1   8/2002
DE    10 2007 049 481 A1   4/2008
(Continued)

OTHER PUBLICATIONS

Jun Hasui et al.; "The Welding Dictionary"; pp. 224-226; Asakura Publishing Co., Ltd.
(Continued)

*Primary Examiner* — Tan N Tran
(74) *Attorney, Agent, or Firm* — Studebaker Brackett PLLC

(57) ABSTRACT

There is provided a semiconductor device including an insulating substrate provided with a circuit surface, and an external terminal bonded to the circuit surface. The circuit surface has an upper surface that is in contact with and bonded to a part of a lower surface of the external terminal. In at least a part of a portion where the upper surface of the circuit surface and the lower surface of the external terminal are in contact with each other, a melted portion of the circuit surface and the external terminal is formed. A gap between the upper surface of the circuit surface and the lower surface of the external terminal has a size of 20 μm or less. The circuit surface and the external terminal are each made of copper or copper alloy.

5 Claims, 4 Drawing Sheets

(51) Int. Cl.
*H01L 23/31* (2006.01)
*H01L 23/49* (2006.01)
*H01L 23/495* (2006.01)

(52) U.S. Cl.
CPC .. *H01L 23/49562* (2013.01); *H01L 23/49575* (2013.01); *H01L 24/49* (2013.01); *H01L 24/73* (2013.01); *H01L 2224/04042* (2013.01); *H01L 2224/05647* (2013.01); *H01L 2224/48091* (2013.01); *H01L 2224/48228* (2013.01); *H01L 2224/484* (2013.01); *H01L 2224/73265* (2013.01)

(58) Field of Classification Search
CPC ............... H01L 24/49; H01L 24/73; H01L 2224/04042; H01L 2224/05647; H01L 2224/48091; H01L 2224/48228; H01L 2224/484; H01L 2224/73265; H01L 23/3107; H01L 24/29; H01L 24/32; H01L 24/45; H01L 24/48; H01L 24/83; H01L 2224/29111; H01L 2224/29339; H01L 2224/29347; H01L 2224/32225; H01L 2224/32245; H01L 2224/45014; H01L 2224/45015; H01L 2224/45124; H01L 2224/45147; H01L 2224/48137; H01L 2224/48247; H01L 2224/48472; H01L 2224/83801; H01L 2224/8384; H01L 2924/10272; H01L 2924/1033; H01L 2924/181; H01L 23/04; H01L 23/053; H01L 23/24; H01L 23/36; H01L 23/49517; H01L 23/49537; H01L 23/49811; H01L 23/3735; H01L 24/81; H01L 2224/81224; H02M 7/5387
USPC .................................................. 257/734, 779
See application file for complete search history.

(56) References Cited

U.S. PATENT DOCUMENTS

| | | | |
|---|---|---|---|
| 11,031,422 B2* | 6/2021 | Sasaki | ............... H01L 27/14627 |
| 2002/0105075 A1 | 8/2002 | Ferber et al. | |
| 2008/0150102 A1 | 6/2008 | Yokomae et al. | |
| 2012/0001336 A1 | 1/2012 | Zeng et al. | |
| 2015/0179539 A1 | 6/2015 | Tamai | |

FOREIGN PATENT DOCUMENTS

| | | |
|---|---|---|
| DE | 10 2017 115 879 A1 | 1/2019 |
| EP | 2 571 053 A1 | 3/2013 |
| JP | H11-185838 A | 7/1999 |
| JP | 2008-205058 A * | 9/2008 |
| JP | 2009-147124 A | 7/2009 |
| WO | 2013/118422 A1 | 8/2013 |
| WO | 2017/195625 A1 | 11/2017 |

OTHER PUBLICATIONS

Office Action issued in JP 2018-137588; mailed by the Japanese Patent Office on Jun. 8, 2021.
An Office Action issued by the German Patent Office on Mar. 15, 2022, which corresponds to German Patent Application No. 10 2019 210 172.0 and is related to U.S. Appl. No. 17/494,128 with English language translation.
An Office Action mailed by China National Intellectual Property Administration on Jan. 19, 2023, which corresponds to Chinese Patent Application No. 201910650002.8 and is related to U.S. Appl. No. 17/494,128; with English language translation.
An Office Action mailed by China National Intellectual Property Administration on Jan. 6, 2024, which corresponds to Chinese Patent Application No. 201910650002.8 and is related to U.S. Appl. No. 17/494,128; with English language translation.
An Office Action mailed by China National Intellectual Property Administration on Aug. 5, 2023, which corresponds to Chinese Patent Application No. 201910650002.8 and is related to U.S. Appl. No. 17/494,128; with English language translation.
An Office Action issued by the German Patent and Trademark Office on Jul. 5, 2024, which corresponds to German Patent Application No. 102019210172.0 and is related to U.S. Appl. No. 17/494,128; with English language translation.

* cited by examiner

SEMICONDUCTOR DEVICE, POWER CONVERTER, METHOD FOR MANUFACTURING SEMICONDUCTOR DEVICE, AND METHOD FOR MANUFACTURING POWER CONVERTER

CROSS-REFERENCE TO RELATED APPLICATIONS

This application is a Divisional of U.S. patent application Ser. No. 16/443,350 filed Jun. 17, 2019, which claims benefit of priority to Japanese Patent Application No. 2018-137588 filed Jul. 23, 2018, the entire content of which is incorporated herein by reference.

BACKGROUND OF THE INVENTION

Field of the Invention

The technique disclosed in the specification of the present application relates to a semiconductor device, a power converter, a method for manufacturing a semiconductor device, and a method for manufacturing a power converter.

Description of the Background Art

In recent years, as the environmental regulations are strengthened, there is an increasing demand for highly efficient and energy-saving semiconductor devices that take environmental issues into consideration.

Semiconductor devices are used for industrial equipment, drive control equipment for home appliances equipped with motors, on-vehicle control equipment for electric vehicles or hybrid vehicles, railway control equipment, control equipment for solar power generation, and the like, and higher electric power, higher withstand voltage, and higher durability, are required to be achieved.

Particularly, in on-vehicle control equipment or railway control equipment, semiconductor devices are used under a high-load environment (i.e., under a high-temperature environment) from the viewpoint of energy saving or suppression of conversion loss of electric energy (i.e., having become high Tj), so that it is required to operate with high efficiency and low loss even under such a high temperature environment.

Specifically, typical operating temperature has included a Tj (junction temperature) of 125° C., or 150° C. or less, but from now on, it is necessary to correspond to operation in a high temperature environment where Tj is 175° C., or 200° C. or more.

Thus, to achieve low loss, i.e., high efficiency in a high temperature state by suppressing switching loss under the high temperature environment as described above, the structure of the semiconductor device needs to be reconsidered.

In particular, a wiring connection portion (i.e., a joint portion) in the semiconductor device is most likely to deteriorate, and there is a major challenge of achieving high quality, high reliability, and long life of the wiring connection portion (i.e., the joint portion) (refer to International Publication No. 2017/195625, for example).

In recent years, instead of solder, wiring connection development has been advanced in joining using yttrium-aluminum-garnet (YAG) laser, $CO_2$ laser, semiconductor laser, or the like.

In addition, technology development in an oscillator of a fiber laser has progressed to enable increase in output of the laser, so that consideration of using the laser for copper (Cu) having low laser reflectance (i.e., thermal absorptivity) has started.

Unfortunately, internal wiring of a power semiconductor device using a fiber laser has a problem of durability. In particular, terminal bonding has a large variation in bonding strength (or variation in weld penetration depth). This causes difficulty in securing bonding stability, so that it is difficult to put the power semiconductor device, which is required to have high reliability, into practical use.

SUMMARY

It is an object of the technique disclosed in the specification of the present application to provide a technique for suppressing variations in bonding strength of terminal bonding and improving reliability of a device.

A first aspect of the technique disclosed in the specification of the present application is a semiconductor device including an insulating substrate provided at least on its upper surface with a circuit surface, a semiconductor element disposed on an upper surface of the circuit surface with a bonding material interposed therebetween, and an external terminal bonded to the upper surface of the circuit surface. The upper surface of the circuit surface is in contact with and bonded to a part of a lower surface of the external terminal. In at least a part of a portion where the upper surface of the circuit surface and the lower surface of the external terminal are in contact with each other, a melted portion of the circuit surface and the external terminal is formed. A gap between the upper surface of the circuit surface and the lower surface of the external terminal has a gap with a size of 20 µm or less. The circuit surface and the external terminal are each made of copper or copper alloy.

A second aspect of the technique disclosed in the specification of the present application includes a metal plate, a semiconductor element disposed on an upper surface of the metal plate with a bonding material interposed therebetween, and an external terminal bonded to the upper surface of the metal plate. The upper surface of the metal plate and a lower surface of the external terminal are in contact with each other with a conductive material interposed therebetween. In at least a part of a portion where the upper surface of the metal plate and the lower surface of the external terminal are in contact with each other, a melted portion of the metal plate, the external terminal, and the conductive material is formed. The metal plate and the external terminal are each made of copper or copper alloy.

A third aspect of the technique disclosed in the specification of the present application includes a conversion circuit that includes the semiconductor device of any one of the above-described aspects, and converts received power and outputs the converted power, a drive circuit that outputs a driving signal for driving the semiconductor device to the semiconductor device, and a control circuit that outputs a control signal for controlling the drive circuit to the drive circuit.

A fourth aspect of the technique disclosed in the specification of the present application is configured to include the steps of: preparing an insulating substrate provided at least on its upper surface with a circuit surface; disposing a semiconductor element on an upper surface of the circuit surface with a bonding material interposed therebetween; irradiating an upper surface of the external terminal with a fiber laser to bond a lower surface of the external terminal to the upper surface of the circuit surface; bringing the upper surface of the circuit surface into contact with and bonded to a part of the lower surface of the external terminal; and forming a melted portion of the circuit surface and the external terminal in at least a part of a portion where the upper surface of the circuit surface and the lower surface of the external terminal are in contact with each other; in which a gap between the upper surface of the circuit surface and the lower surface of the external terminal has a size of 20 μm or less.

A fifth aspect of the technique disclosed in the specification of the present application is configured to include the steps of: preparing a metal plate; disposing a semiconductor element on an upper surface of the metal plate with a bonding material interposed therebetween; disposing an external terminal on the upper surface of the metal plate with a conductive material interposed therebetween; irradiating an upper surface of the external terminal with a fiber laser to bond a lower surface of the external terminal to the upper surface of the metal plate with the conductive material interposed therebetween; bringing the upper surface of the metal plate and the lower surface of the external terminal into contact with each other with the conductive material interposed therebetween; and forming a melted portion of the metal plate, the external terminal, and the conductive material, in at least a portion where the upper surface of the metal plate and the lower surface of the external terminal are in contact with each other.

A sixth aspect of the technique disclosed in the specification of the present application is configured to include the steps of: providing a conversion circuit that includes the semiconductor device of any one of the above-described aspects, and converts received power and outputs the converted power; providing a drive circuit that outputs a driving signal for driving the semiconductor device to the semiconductor device; and providing a control circuit that outputs a control signal for controlling the drive circuit to the drive circuit.

According to the first aspect of the technique disclosed in the specification of the present application, the gap generated between the circuit surface and the external terminal has a size of 20 μm or less due to the melted portion, so that variations in bonding strength can be suppressed. This enables increase in reliability of the semiconductor device.

According to the second aspect of the technique disclosed in the specification of the present application, the conductive material sandwiched between the upper surface of the metal plate and the external terminal maintains the bonding strength due to the melted portion, so that variations in bonding strength can be suppressed. This enables increase in reliability of the semiconductor device.

According to the third aspect of the technique disclosed in the specification of the present application, the gap formed between the material to be bonded and the external terminal has a size of 20 μm or less due to the molten portion, variations in bonding strength can be suppressed.

According to the fourth aspect of the technique disclosed in the specification of the present application, the melted portion is formed by using a fiber laser to form the gap between the circuit surface and the external terminal, having a size of 20 μm or less, so that variations in bonding strength can be suppressed. This enables increase in reliability of the semiconductor device.

According to the fifth aspect of the technique disclosed in the specification of the present application, the melted portion is formed by using a fiber laser to cause the conductive material sandwiched between the upper surface of the metal plate and the external terminal to maintain bonding strength, so that variations in bonding strength can be suppressed. This enables increase in reliability of the semiconductor device.

According to the sixth aspect of the technique disclosed in the specification of the present application, variations in bonding strength can be suppressed due to the melted portion. This enables increase in reliability of the power converter.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
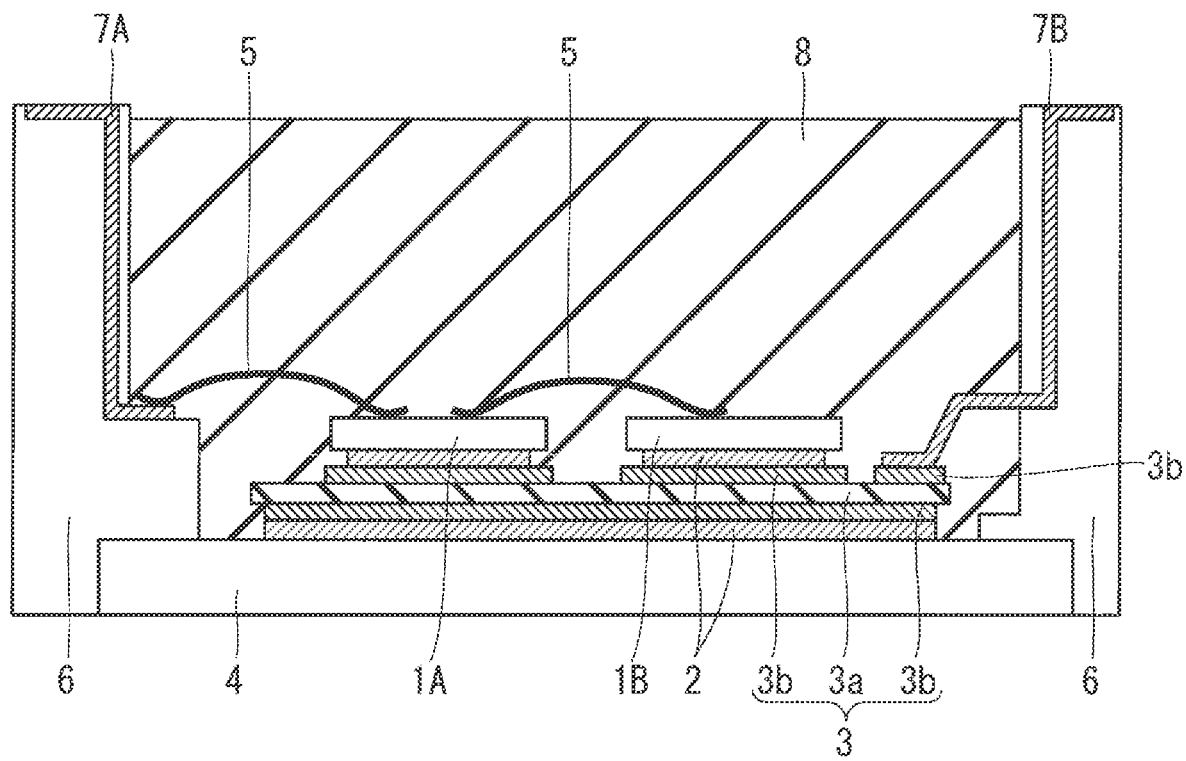
FIG. 1 is a sectional view schematically illustrating an example of a configuration of a power semiconductor device operable in a high-temperature environment, according to a preferred embodiment.

Hereinafter, preferred embodiments will be described with reference to the accompanying drawings.

The drawings are schematically illustrated, and a configuration is eliminated or simplified as appropriate, for convenience of description. In addition, a mutual relationship between size and position of a configuration and the like, illustrated in each of different drawings, is not necessarily described accurately and can be appropriately changed. In drawings such as a plan view that is not a sectional view, hatching may be added to facilitate understanding of contents of a preferred embodiment.

In the following description, similar components are denoted by the same reference numerals, and their names and functions are also similar. Thus, detailed description thereof may be eliminated to avoid duplication.

Even when terms each meaning a specific position and direction, such as "above", "below", "left", "right", "side", "bottom", "front", or "back", are used in the description below, these terms are used for convenience to facilitate understanding of contents of a preferred embodiment, and are each not related to a direction at the time of actual implementation.

First Preferred Embodiment

Hereinafter, a semiconductor device according to the present preferred embodiment and a method for manufacturing a semiconductor device will be described.

<Configuration of Power Semiconductor Device>

FIG. 1 is a sectional view schematically illustrating an example of a configuration of a power semiconductor device operable in a high-temperature environment, according to the present preferred embodiment.

The power semiconductor device illustrated by way of example in the present preferred embodiment includes a heat sink 4 with heat dissipation, an insulating substrate 3 bonded to an upper surface of the heat sink 4 with a bonding material 2 interposed therebetween, having insulating properties, a semiconductor element 1A bonded to an upper surface of the insulating substrate 3 with the bonding material 2 interposed therebetween, and a semiconductor element 1B bonded to the upper surface of the insulating substrate 3 with a bonding material 2 interposed therebetween.

Here, the insulating substrate 3 includes an insulating material 3a, and a circuit surface 3b formed on each of an upper surface and a lower surface of the insulating material 3a.

The semiconductor element 1A is electrically connected on its upper surface to a terminal 7A made of copper or copper alloy connected to an external input-output of the power semiconductor device, or to an upper surface of another semiconductor element 1B, with a wire 5. The terminal 7B is made of copper or copper alloy, and is bonded to the circuit surface 3b on the upper surface of the insulating substrate 3.

Then, the power semiconductor device is mounted surrounded by a case 6, and the inside of the case 6 is filled with a sealing material 8 that is an insulating material.

The insulating substrate 3, the semiconductor element 1A, the semiconductor element 1B, a part of the terminal 7A, and a part of the terminal 7B, are covered with the sealing material 8.

The semiconductor element 1A and the semiconductor element 1B each have a length of a side of 3 mm or more and 18 mm or less, and are each an element or a diode, having a switching function capable of converting electric power, such as an insulated gate bipolar transistor, i.e., an IGBT, and a metal-oxide-semiconductor field-effect transistor, i.e., a MOSFET, for example.

The semiconductor element 1A and the semiconductor element 1B each employ a Si semiconductor or a wide bandgap semiconductor (e.g., made of SiC or GaN) that can be controlled with higher efficiency and lower loss, for example.

For example, in the case where the semiconductor element 1A and the semiconductor element 1B are each an IGBT, a back-surface electrode formed on a lower surface of each of the semiconductor elements 1A and 1B is a collector electrode, and upper-surface electrodes formed on upper surfaces of the semiconductor elements 1A and 1B are an emitter electrode and a gate electrode, respectively. Each electrode is made of a material containing Al, Au, Ag or copper (Cu), as a main component, by a sputtering method or a plating method.

The heat sink 4 is made of copper, a copper-alloy complex, Al, an Al-alloy complex, or AlSiC to have a length of a side of 30 mm or more and 300 mm or less and a thickness of 3 mm or more and 20 mm or less, for example, with a large heat capacity.

The heat sink 4 is connected to a lower surface of the insulating substrate 3 with the bonding material 2 interposed therebetween. The heat sink 4 has a lower surface exposed from the sealing material 8.

While there is no illustration, a surface mounted with no semiconductor elements 1A and 1B, i.e., the lower surface of the heat sink 4, is connected to a fin-shaped structure with thermal grease or a thermal interface material (TIM), interposed therebetween. The fin-shaped structure described above may be formed integrally with the heat sink 4, or may be formed integrally with a water-cooling jacket.

The semiconductor elements 1A and 1B generate heat during switching operation, so that the heat sink 4 directly cools the semiconductor elements 1A and 1B while heat capacity is secured by the heat sink 4, as described above. This enables the semiconductor elements 1A and 1B to obtain a desired switching function with little loss.

The wire 5 is a wire material composed of mainly Al or copper (Cu), and is used as an internal wire of the power semiconductor device. In FIG. 1, the wire 5 is used as a plurality of pieces of wire bonding.

The wire 5 has a diameter of 300 μm or more and 500 μm or less, for example. Copper (Cu) can be increased in current density more than Al, so that Cu and Al are appropriately used according to current specifications of the power semiconductor device in consideration of a wire material and a wire diameter.

The wire 5 may be a flat-shaped (e.g., a ribbon-like) wire material having a thickness of 0.1 mm or more and 0.5 mm or less, for example. This kind of shape enables the wire 5 to correspond to various levels of current, and causes low-resistance to enable suppressing the amount of self-heating.

The bonding material 2 used between the semiconductor element 1A and the circuit surface 3b on the upper surface of the insulating substrate 3, and between the semiconductor element 1B and the circuit surface 3b on the upper surface of the insulating substrate 3, and between the circuit surface 3b on the lower surface of the insulating substrate 3 and the heat sink 4, is a Pb-free solder material composed of mainly Sn, for example. Alternatively, the bonding material 2 is a sintered bonding material composed of fine metal particles of Ag or copper (Cu), a solvent, and the like, with a high heat resistance of 400° C. or more.

Thus, the above-described bonding material 2 can also be applied to a power semiconductor device mounted with an SiC element, a GaN element, or the like, which operates in a high-temperature environment.

The bonding material 2 has a bonding thickness of 10 μm or more and 300 μm or less, for example. The bonding thickness is determined in consideration of damage to the semiconductor elements 1A and 1B. The bonding material 2 has a sufficient thermal conductivity, so that there is no problem of thermal resistance due to a thick bonding thickness.

To the periphery of the heat sink 4 in plan view, the case 6 serving as an outer shell of the power semiconductor device is adhered with an adhesive (here, not illustrated) or the like.

The case 6 surrounds the periphery of the semiconductor element 1A, the semiconductor element 1B, the wire 5, and the insulating substrate 3, in plan view. The case 6 made of poly phenylene sulfide (PPS) resin, polybutylene terephthalate (PBT) resin, or the like, is integrally molded with the terminals 7A and 7B.

The inner region surrounded by the case 6 is sealed (i.e., injected) with a sealing material 8 that is a resin mainly composed of epoxy, or a gel-like silicone resin, for example.

While there is no illustration in FIG. 1, a control board mounted with a drive circuit or a protection circuit may be sealed in the inner region surrounded by the case 6.

When this kind of control board is mounted, a part of the terminal 7A or 7B is connected to a control board mounted with a drive circuit or a protection circuit, and a control signal for performing switching operation is input to the control board from the terminal 7A or 7B.

The control board mounted in the inner region surrounded by the case 6 is disposed on the upper surface of the heat sink 4 in a state substantially parallel to the insulating substrate 3 or the heat sink 4 while being supported by the terminal 7A or 7B.

The terminal 7A connected from the semiconductor element 1A by wiring with the wire 5 (i.e., a wire) composed of mainly Al or copper (Cu), and the terminal 7B bonded to the circuit surface 3b on the upper surface of the insulating substrate 3 by fiber laser bonding, are each an AC output terminal and an input-output terminal, for input from and output to the outside, and a signal terminal for control. The terminals 7A and 7B are each made of copper or copper alloy having a thickness of about 1 mm.

The terminals 7A and 7B are each connected to an electric motor such as a motor, a battery, or a harness.

The insulating substrate 3 includes the insulating material 3a, and the circuit surface 3b formed on each of the upper surface and the lower surface of the insulating material 3a. The insulating material 3a is made of AlN, $Si_3N_4$, or $Al_2O_3$, and has a thickness of 1 mm or less, for example.

The circuit surface 3b on the upper surface of the insulating substrate 3 is made of copper or copper alloy. The circuit surface 3b made of copper or copper alloy is easily oxidized, so that Ni-plating or Sn-plating may be applied thereto.

Figure 2:
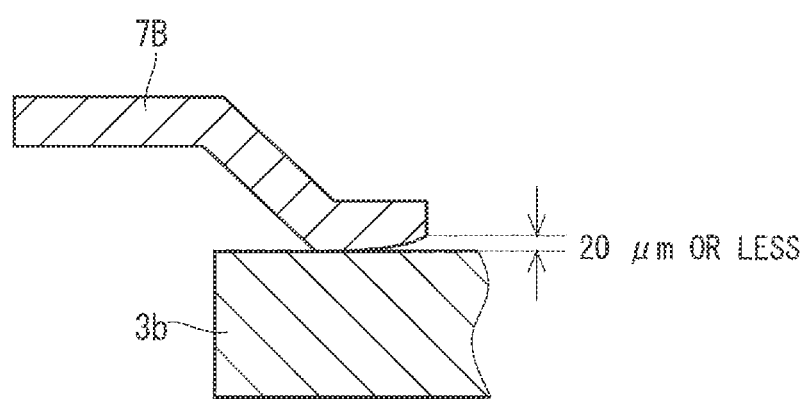
FIG. 2 is an enlarged view illustrating a configuration of a contact portion between a terminal and an insulating substrate of a power semiconductor device according to a preferred embodiment.
Figure 3:
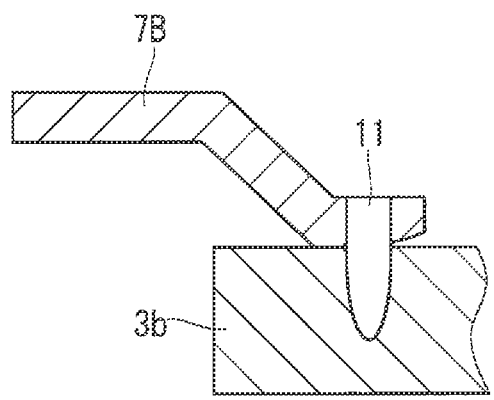
FIG. 3 is an enlarged view illustrating a configuration of a contact portion between a terminal and an insulating substrate of a power semiconductor device according to a preferred embodiment.

FIGS. 2 and 3 are each an enlarged view illustrating a configuration of a contact portion between the terminal and the insulating substrate of the power semiconductor device according to the present preferred embodiment.

As an example is illustrated in FIG. 2, the circuit surface 3b on the upper surface of the insulating substrate 3 is bonded to the terminal 7B such that a part of the lower surface of the terminal 7B is in contact with the upper surface of the circuit surface 3b, i.e., the other portion of the lower surface of the terminal 7B is not in contact with the upper surface of the circuit surface 3b. In a portion where the lower surface of the terminal 7B and the upper surface of the circuit surface 3b are not in contact with each other, there is generated a gap that is not uniform in size and has a size of 20 μm or less, for example.

Next, as an example is illustrated in FIG. 3, while a part of the lower surface of the terminal 7B is not in contact with the upper surface of the circuit surface 3b as illustrated in FIG. 2, an upper surface of the terminal 7B, i.e., a surface of the terminal 7B, opposite to the surface in contact with the circuit surface 3b, is locally irradiated with a fiber laser with a high energy density. Then, only the terminal 7B and the circuit surface 3b are melted by using heat of the irradiation to form a melted portion 11 so that the lower surface of the terminal 7B and the upper surface of the circuit surface 3b are bonded to each other.

The melted portion 11 has a size of 5 mm² or more and 12 mm² or less in plan view, for example.

The fiber laser has a wavelength of 500 nm or more and 1200 nm or less, for example. The fiber laser is radiated vertically downward from the upper surface of the terminal 7B in a time of is or less.

Conventional YAG lasers, $CO_2$ lasers, semiconductor lasers, and the like, each have energy insufficient for copper with a low absorption rate of laser energy. In contrast, a fiber laser can obtain a sufficient output of several KW.

Figure 4:
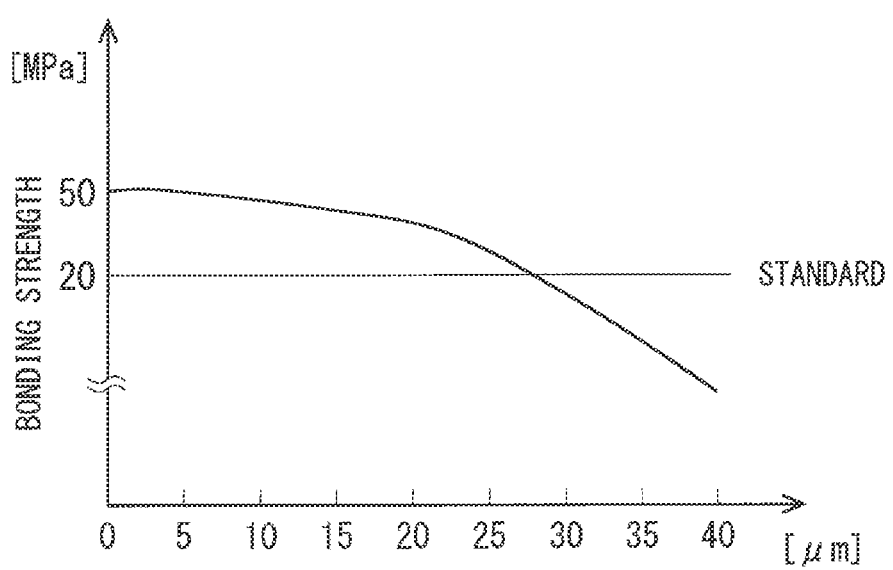
FIG. 4 is a graph illustrating an example of a correlation between a gap and a bonding strength generated between a terminal and a circuit surface, according to a preferred embodiment.

FIG. 4 is a graph illustrating an example of a correlation between a gap and a bonding strength generated between a terminal and a circuit surface, according to the present preferred embodiment. In FIG. 4, the vertical axis represents bonding strength [MPa], and the horizontal axis represents gap size [μm].

As illustrated in FIG. 4, to satisfy bonding strength defined by the standard, such as 20 MPa, the gap generated between the terminal and the circuit surface is required to have a size of 20 μm or less.

In the case illustrated in FIGS. 2 and 3, the terminal 7B and the circuit surface 3b are partially in contact with each other. Thus, when bonding strength satisfying the standard value is achieved in the correlation illustrated in FIG. 4 on the premise that there is no point of contact, required bonding strength can be sufficiently satisfied.

According to the above description, using a fiber laser with a high energy density enables sufficient penetration, i.e., the melted portion 11 to be obtained from the upper surface of the terminal 7B to the circuit surface 3b on the upper surface of the insulating substrate 3 as illustrated in FIG. 3 as an example.

In addition, when a plurality of positions in the same bonding portion between the terminal 7B and the circuit surface 3b is irradiated with the fiber laser, the bonded area between the terminal 7B and the circuit surface 3b can be further increased. This enables achieving not only highly reliable wiring connection by improving stability of bonding, but also long life of the power semiconductor device.

The fiber laser has a high energy density, so that irradiation time for bonding is very short. Specifically, several tens to several hundred ms per irradiation point are only required to result in 1s or less for each bonding. This enables improvement in productivity.

Typically, in the case of bonding with a YAG laser, a $CO_2$ laser, a semiconductor laser, or the like, the periphery of a bonding portion needs to be pressed with a pressing jig or the like. The pressing jig presses the terminal 7B toward the insulating substrate 3 in the vertically downward direction.

Meanwhile, when the melted portion 11 is formed using a laser with a high energy density such as a fiber laser with a gap generated between the terminal 7B and the circuit surface 3b, the gap having a size of 20 μm or less, bonding satisfying the standard value of the bonding strength can be obtained without using the pressing jig.

In recent years, power semiconductor devices to be mounted on railroads or vehicles are required to downsized from the viewpoint of restricting an installation space. Thus, the insulating substrate 3 to be mounted is also reduced in size, and accordingly, the bonding area between the terminal 7B and the circuit surface 3b tends to be restricted to small area. In contrast, the bonding between the terminal 7B and the circuit surface 3b according to the present preferred embodiment enables achieving a sufficient bonding strength without using a pressing jig, so that downsizing of the power semiconductor device also can be achieved.

Meanwhile, depending on a relationship between a placement position of the insulating substrate 3 and a placement position of the terminal 7B, a gap of 20 μm or less may not be generated between the terminal 7B and the circuit surface 3b. Such a case requires a pressing jig to be used.

In such a case, instead of the periphery of the bonding portion between the terminal 7B and the circuit surface 3b, a portion in a bent shape (i.e., a bend shape) is pressed by using a pressing jig.

This causes the portion pressed by the pressing jig and the bonding portion to be away from each other, so that a gap is also formed at a tip of the terminal 7B in the bonding portion as illustrated in FIG. 2 in many cases.

Even in such a case, the bonding between the terminal 7B and the circuit surface 3b according to the present preferred embodiment with a gap generated between the terminal 7B and the circuit surface 3b, having a size of 20 μm or less enables obtaining a bonding strength satisfying the standard value as well as good bonding.

Second Preferred Embodiment

A semiconductor device according to the present preferred embodiment and a method for manufacturing the semiconductor device will be described. In the following description, components similar to those described in the preferred embodiment described above are denoted by the same reference numerals, and the detailed description thereof will be eliminated as appropriate.

<Configuration of Power Semiconductor Device>

Figure 5:
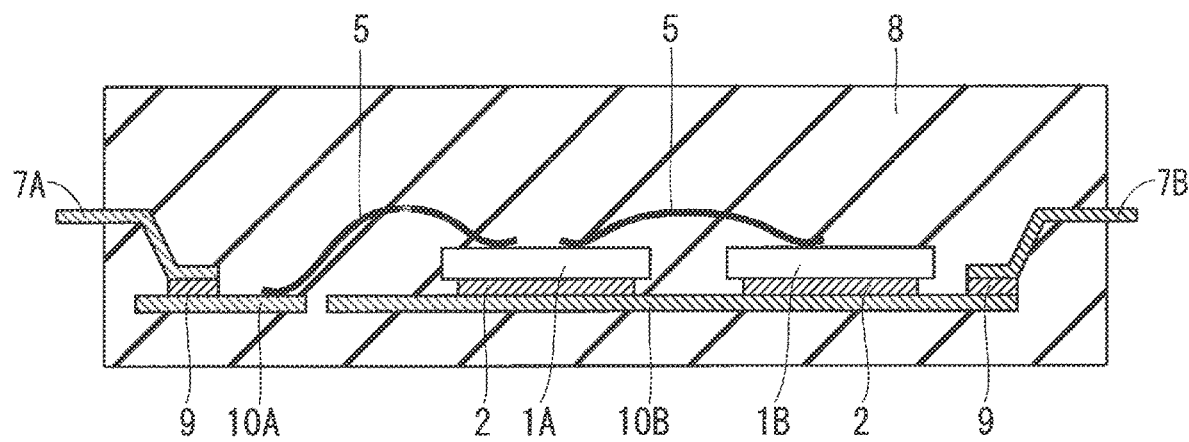
FIG. 5 is a sectional view schematically illustrating an example of a configuration of a power semiconductor device according to a preferred embodiment.

FIG. 5 is a sectional view schematically illustrating an example of a configuration of a power semiconductor device according to the present preferred embodiment. The power semiconductor device shown by way of example in the present preferred embodiment includes a conductive metal plate 10A, a conductive metal plate 10B disposed away from the conductive metal plate 10A, a semiconductor element 1A bonded to an upper surface of the conductive metal plate 10B with a bonding material 2 interposed therebetween, a semiconductor element 1B bonded to the upper surface of the conductive metal plate 10B with the bonding material 2 interposed therebetween, a wire 5 composed of mainly Al or copper (Cu), connecting the semiconductor element 1A to the semiconductor element 1B, a terminal 7A made of copper or copper alloy connected to an upper surface of the conductive metal plate 10A with a metallic conductive material 9 interposed therebetween, a terminal 7B made of copper or copper alloy connected to an upper surface of the metal plate 10B with the metallic conductive material 9 interposed therebetween, and a wire 5 connecting an upper surface of the semiconductor element 1A to an upper surface of the conductive metal plate 10A.

The conductive metal plate 10A, the conductive metal plate 10B, the semiconductor element 1A, the semiconductor element 1B, a part of the terminal 7A, and a part of the terminal 7B, are sealed using a sealing material 8 such as epoxy resin by transfer molding, for example.

Among them, the conductive metal plate 10A and the conductive metal plate 10B are potentials (electrodes) different from each other.

The conductive metal plates 10A and 10B each have a lower surface that may be provided with an insulating metal layer having insulating properties.

Here, the insulating metal layer has a laminated structure composed of an insulating layer and a protective metal layer. The insulating layer is made of an epoxy resin mixed with a filler such as boron nitride or alumina. Then, a protective metal layer made of copper or aluminum having high thermal conductivity is fixed to the insulating layer.

For example, the semiconductor element 1A and the semiconductor element 1B are each assumed to be a semiconductor element such as an IGBT having a collector electrode as a back-face electrode, and a gate electrode and an emitter electrode as a front-face electrode, or a semiconductor element having a diode function. The power semiconductor device according to the present preferred embodiment is configured such that these two types of semiconductor elements are used as a pair of the semiconductor element 1A and the semiconductor element 1B.

The terminals 7A and 7B each receive a signal from the outside, and operation control of the power semiconductor device (specifically, on-off control of switching operation, etc.) is performed. The semiconductor elements 1A and 1B are each not limited to a IGBT, a MOSFET, or a diode, using Si, and may be one of them, using SiC or GaN, for example.

The conductive metal plate 10A and the conductive metal plate 10B are each a flat plate made of copper or copper alloy. The conductive metal plate 10A and the conductive metal plate 10B each have a thickness of 0.2 mm or more and 1 mm or less. This may cause the conductive metal plate 10A and the conductive metal plate 10B to be unstable in position on the circuit and to be warped or tilted.

Figure 6:
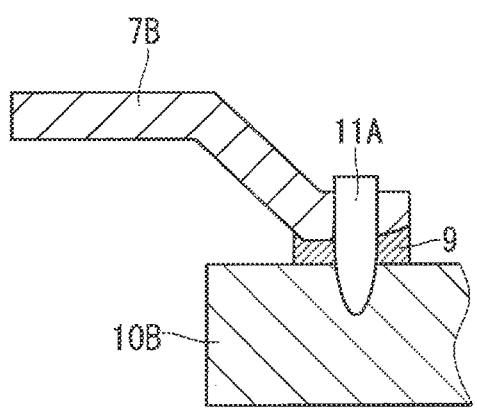
FIG. 6 is an enlarged view illustrating a configuration of a contact portion between a terminal and a conductive metal plate of a power semiconductor device according to a preferred embodiment.

FIG. 6 is an enlarged view illustrating a configuration of a contact portion between a terminal and a conductive metal plate of a power semiconductor device according to the present preferred embodiment.

As illustrated in the example in FIG. 6, while a gap having an uneven size is generated between the terminal 7B and the conductive metal plate 10B, a melted portion 11A can be formed by irradiating the upper surface of the terminal 7B with the metallic conductive material 9 interposed therebetween with a fiber laser having a high energy density to melt the portions from the terminal 7B to the metallic conductive material 9, further to the conductive metal plate 10B. In this state, the upper surface of the conductive metal plate 10B and the lower surface of the terminal 7B are in contact with each other with the metallic conductive material 9 interposed therebetween.

The melted portion 11A has a size of 5 mm$^2$ or more and 12 mm$^2$ or less in plan view, for example.

The metallic conductive material 9 is formed beyond a range where the conductive metal plate 10B and the terminal 7B overlap with each other in plan view. In other words, the metallic conductive material 9 is formed squeezed out from the range where the conductive metal plate 10B and the terminal 7B overlap with each other in plan view.

The metallic conductive material 9 has a thickness of 200 μm or less, or 300 μm or less at a bonded portion of the upper surface of the conductive metal plate 10B and the lower surface of the terminal 7B. That is, in the case where a gap of 20 μm or more is formed, the metallic conductive material 9 is formed in the gap to secure bonding strength.

The fiber laser has a wavelength of 500 nm or more and 1200 nm or less, for example.

As described above, even a portion between the terminal 7B and the conductive metal plate 10B, having an unstable positional relationship therebetween, forming the melted portion 11A having a sufficient penetration depth enables achieving highly stable bonding having required bonding strength. This enables achieving not only highly reliable wiring connection, but also long life of the power semiconductor device.

While there is only one bonding portion between the terminal 7B and the conductive metal plate 10B in FIG. 6, a plurality of the melted portions 11A allows bonding strength to be further stabilized.

Third Preferred Embodiment

A power converter according to the present preferred embodiment and a method for manufacturing the power converter will be described. In the following description, components similar to those described in the preferred embodiment described above are denoted by the same reference numerals, and the detailed description thereof will be eliminated as appropriate.

<Configuration of Power Converter>

In the present preferred embodiment, the power semiconductor device according to each of the preferred embodiments described above is applied to a power converter. The power converter to be applied is not limited to that for specific use, and a case of applying it to a three-phase inverter will be described below.

Figure 7:
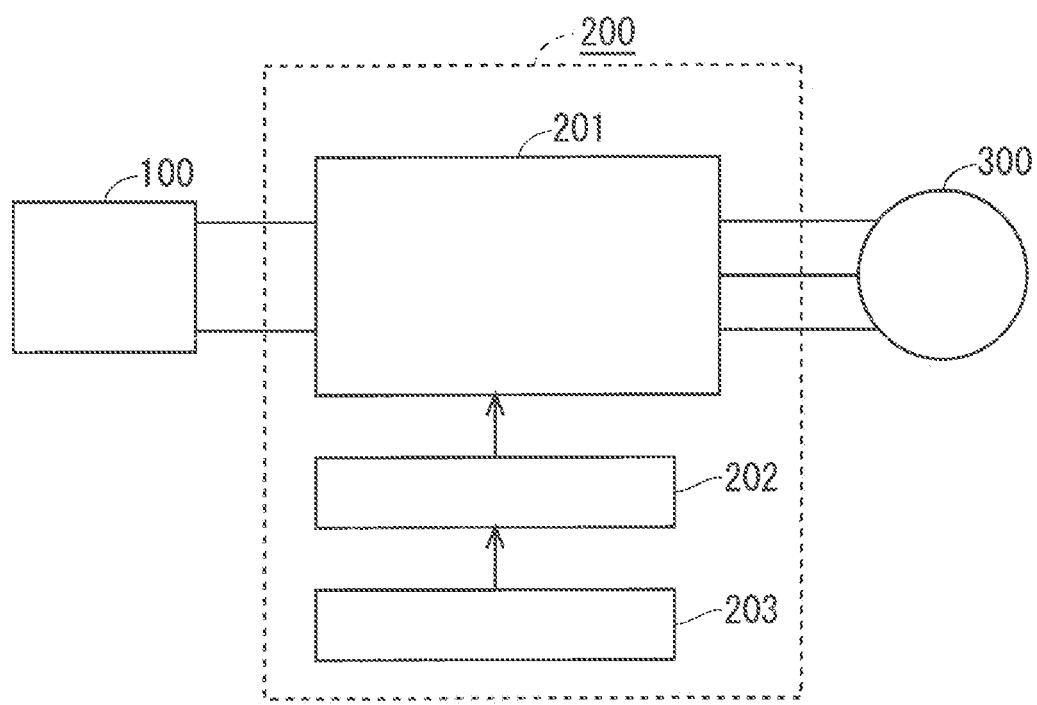
FIG. 7 is a diagram conceptually illustrating an example of a configuration of a power conversion system including a power converter according to a preferred embodiment.

FIG. 7 is a diagram conceptually illustrating an example of a configuration of a power conversion system including the power converter according to the present preferred embodiment.

As an example is illustrated in FIG. 7, the power conversion system includes a power supply 100, a power converter 200, and a load 300. The power supply 100 is a DC power supply and supplies DC power to the power converter 200. The power supply 100 can be formed of various kinds of source such as a DC system, a solar battery, or a storage battery, for example. The power supply 100 also can be formed of a rectifier circuit, an AC-DC converter, or the like, connected to an AC system. In addition, the power supply 100 can be formed of a DC-DC converter that converts DC power output from a DC system to predetermined power.

The power converter 200 is a three-phase inverter connected between the power supply 100 and the load 300. The power converter 200 converts DC power supplied from the power supply 100 into AC power, and supplies the AC power to the load 300.

As an example is illustrated in FIG. 7, the power converter 200 includes a conversion circuit 201 that converts DC power into AC power and outputs the AC power, a drive circuit 202 that outputs a driving signal for driving each switching element of the conversion circuit 201, and a control circuit 203 that outputs a control signal for controlling the drive circuit 202 to the drive circuit 202.

The load 300 is a three-phase motor driven by AC power supplied from the power converter 200. The load 300 is not limited to specific use, and is an electric motor mounted on various kinds of electric equipment, being used for a hybrid vehicle, an electric vehicle, a railway car, an elevator, or air conditioning equipment, for example.

Hereinafter, details of the power converter 200 will be described. The conversion circuit 201 includes a switching element and a freewheeling diode (not illustrated here). When the switching element performs switching operation, DC power supplied from the power supply 100 is converted into AC power and the AC power is supplied to the load 300.

While there are various specific circuit configurations of the conversion circuit 201, the conversion circuit 201 according to the present preferred embodiment is a two-level three-phase full bridge circuit, and includes six switching elements, and six freewheeling diodes connected to the respective switching elements in antiparallel.

The power semiconductor device in any one of the preferred embodiments described above is applied to at least one of each switching element and each freewheeling diode in the conversion circuit 201. The six switching elements form upper and lower arms such that the switching elements are connected in series two by two, and the upper and lower arms constitute the respective phases (i.e., U-phase, V-phase, and W-phase) of the full bridge circuit. Output terminals of the respective upper and lower arms (i.e., three output terminals of the conversion circuit 201) are connected to the load 300.

The drive circuit 202 generates a driving signal for driving the switching elements of the conversion circuit 201, and supplies the driving signal to a control electrode of each the switching elements of the conversion circuit 201. Specifically, the drive circuit 202 outputs a driving signal for turning on the switching elements and a driving signal for turning off the switching elements to the control electrode of each of the switching elements in response to a control signal output from the control circuit 203 described below.

To maintain the switching elements in an ON state, the driving signal is a voltage signal (i.e., an ON signal) of threshold voltage or more of the switching elements. To maintain the switching elements in an OFF state, the driving signal is a voltage signal (i.e., an OFF signal) less than the threshold voltage of the switching elements.

The control circuit 203 controls the switching elements of the conversion circuit 201 so that desired power is supplied to the load 300. Specifically, the control circuit 203 calculates time (i.e., ON time) for which each switching element of the conversion circuit 201 is to be turned on in accordance with power to be supplied to the load 300. For example, the conversion circuit 201 can be controlled by PWM control that modulates the ON time of the switching elements according to voltage to be output.

Then, the control circuit 203 outputs a control command (i.e., a control signal) to the drive circuit 202 such that an ON signal is output to the switching element to be turned on at each point in time and an OFF signal is output to the switching element to be turned off at each point in time. The drive circuit 202 outputs an ON signal or an OFF signal as a driving signal to the control electrode of each switching element in response to the control signal.

In the power converter 200 according to the present preferred embodiment, the power semiconductor device according to any one of the above-described preferred embodiments is used as the switching element of the conversion circuit 201, so that on-resistance after elapse of an energization cycle can be stabilized.

While an example of applying the power semiconductor device according to any one of the preferred embodiments described above to the two-level three-phase inverter is described in the present preferred embodiment, the application example is not limited thereto. The power semiconductor device according to any one of the preferred embodiments described above can be applied to various power converters.

While the two-level power converter is described in the present preferred embodiment, the power semiconductor device according to any one of the preferred embodiments described above may also be applied to a three-level or multi-level power converter. When power is supplied to a single-phase load, the power semiconductor device according to any one of the preferred embodiments described above may be applied to a single-phase inverter.

When power is supplied to a DC load or the like, the power semiconductor device according to any of the preferred embodiments described above can also be applied to a DC-DC converter or an AC-DC converter.

The power converter, to which the power semiconductor device according to any of the preferred embodiments described above is applied, is not limited to the case where the above-described load is an electric motor, and can be used as a power supply device for an electric discharge machine, a laser processing machine, an induction heating cooker, or a non-contact power supply system. The power converter, to which the power semiconductor device according to any of the preferred embodiments described above is applied, can also be used as a power conditioner in a photovoltaic power generation system or a power storage system.

<Effect Caused by Preferred Embodiments Described Above>

Next, examples of effects caused by the preferred embodiments described above will be described. While the effects are described on the basis of the specific configurations described in the preferred embodiments described above in the following description, the specific configurations may be replaced with another specific configuration including an example described in the specification of the present application, within a scope where a similar effect is caused.

The replacement may be performed over the plurality of preferred embodiments. That is, the replacement may be performed when a similar effect is caused by combining the respective configurations illustrated in examples in different preferred embodiments.

According to the preferred embodiments described above, the power semiconductor device includes the insulating substrate 3, the semiconductor element 1A, and an external terminal. Here, the external terminal corresponds to the terminal 7B, for example. The insulating substrate 3 is provided at least on its upper surface with the circuit surface 3b. The semiconductor element 1A is disposed on the upper surface of the circuit surface 3b with the bonding material 2 interposed therebetween. The terminal 7B is bonded to the upper surface of the circuit surface 3b. The upper surface of the circuit surface 3b is brought into contact with and bonded to a part of the lower surface of the terminal 7B. The melted portion 11 of the circuit surface 3b and the terminal 7B is formed in at least a part of a portion where the upper surface of the circuit surface 3b and the terminal 7B are in contact with each other. The gap generated between the upper surface of the circuit surface 3b and the lower surface of the terminal 7B has a size of 20 μm or less. The circuit surface 3b and the terminal 7B are each made of copper or copper alloy.

According to the configuration described above, the gap generated between the circuit surface 3b and the terminal 7B has a size of 20 μm or less due to the melted portion 11, so that variations in bonding strength can be suppressed. This enables increase in reliability of the power semiconductor device. Using a bonding material such as solder does not need to form a bonding having sufficient bonding strength. This enable reduction in influence of thermal stress or thermal distortion caused by difference in thermal expansion coefficient between the bonding material 2 and the terminal 7B, and between the bonding material 2 and the circuit surface 3b, each of which is dissimilar metal. In addition, the melted portion 11 is only formed to a depth reaching the circuit surface 3b from the terminal 7B, and does not reach the insulating material 3a positioned below the circuit surface 3b. This enables also insulating properties of the insulating substrate 3 to be maintained.

Other configurations other than those including examples described in the specification of the present application can be appropriately eliminated. That is, including at least these configurations can cause the effects described above.

However, even when at least one of the other configurations shown by way of example in the specification of the present application is appropriately added to the above-described configurations, i.e., even when the other configurations shown by way of example in the specification of the present application, which are not described as the configurations described above, is appropriately added, a similar effect can be caused.

As described in "The Welding Dictionary" (Jun Hasui, Tatsuya Hashimoto, Syozaburo Ota, Publisher, Asakura Publishing Co., Ltd, p. 225), for example, the melted portion is a term indicating a state where a welding metal in which the filler metal is melted and a base material (material to be welded or cut) are melted. The state where the welding metal in which the filler metal is melted and the base material are melted indicates a structure in which the terminal 7B not having been melted and the circuit surface 3b are clearly distinguished from each other by whether there is a flow trace of the terminal 7B and the circuit surface 3b until being melted, or the like (crystal grains are different depending on a rapid thermal history), for example.

Thus, the term, "melted portion", merely specifies structure of an object or properties of the object by simply indicating a state thereof.

According to the preferred embodiments described above, the power semiconductor device includes the sealing material 8 formed covering the insulating substrate 3, the semiconductor element 1A, and a part of the terminals 7B. According to such a configuration, insulation performance can be secured by the sealing material 8. This enables increase in reliability of the power semiconductor device.

According to the preferred embodiments described above, the power semiconductor device includes the heat sink 4 connected to the lower surface of the insulating substrate 3 with the bonding material 2 interposed therebetween. The heat sink 4 has a lower surface exposed from the sealing material 8. According to such a configuration, while the heat capacity is secured by the heat sink 4, the heat sink 4 is exposed from the sealing material 8 to dissipate heat to the outside. This enables the semiconductor elements 1A and 1B to obtain a desired switching function with little loss.

According to the preferred embodiments described above, a plurality of the melted portions 11 is formed. According to such a configuration, when the plurality of the melted portions 11 is provided in a bonding portion between the terminal 7B and the circuit surface 3b, the bonded area between the terminal 7B and the circuit surface 3b can be further increased. The fiber laser has an irradiation range that is a relatively narrow range of several micrometers or more and several hundred micrometers or less, for example, so that forming the plurality of the melted portions 11 in one bonding portion to increase the bonded area is effective. This enables achieving not only highly reliable wiring connection by improving stability of bonding, but also long life of the power semiconductor device. Even when there is an abnormality of output of the fiber laser, an abnormality of input of heat, or the like, forming the plurality of the melted portions 11 suppresses unstable bonding.

According to the preferred embodiments described above, power semiconductor device includes the metal plate, the semiconductor element 1A, and the terminal 7B. Here, the metal plate corresponds to the conductive metal plate 10B, for example. The semiconductor element 1A is disposed on the upper surface of the conductive metal plate 10B with the bonding material 2 interposed therebetween. The terminal 7B is bonded to the upper surface of the conductive metal plate 10B. The upper surface of the conductive metal plate 10B and the lower surface of the terminal 7B are in contact with each other with the conductive material interposed therebetween. Here, the conductive material corresponds to the metallic conductive material 9, for example. The melted portion 11A of the conductive metal plate 10B, the terminal 7B, and the metallic conductive material 9 is formed in at least a part of a portion where the upper surface of the conductive metal plate 10B and the lower surface of the terminal 7B are in contact with each other. The metallic conductive material 9 has a thickness of 300 μm or less. The conductive metal plate 10B and the terminal 7B are each made of copper or copper alloy.

According to such a configuration, the metallic conductive material 9 sandwiched between the upper surface of the conductive metal plate 10B and the terminal 7B maintains the bonding strength due to the melted portion 11A, so that variations in bonding strength can be suppressed. This enables increase in reliability of the power semiconductor device. In addition, when the conductive metal plate 10B is a thin plate and has a cantilever shape on the circuit, positioning between the upper surface of the conductive metal plate 10B and the terminal 7B is difficult (in particular, positioning of the terminal 7B in a deflecting direction of the conductive metal plate 10B is difficult). However, when the metallic conductive material 9 is previously provided between the upper surface of the conductive metal plate 10B and the terminal 7B, bonding the upper surface of the conductive metal plate 10B to the terminal 7B using a fiber laser, with the metallic conductive material 9 interposed therebetween, facilitates the positioning therebetween.

Other configurations other than those including examples described in the specification of the present application can be appropriately eliminated. That is, including at least these configurations can cause the effects described above.

However, even when at least one of the other configurations shown by way of example in the specification of the present application is appropriately added to the above-described configurations, i.e., even when the other configurations shown by way of example in the specification of the present application, which are not described as the configurations described above, is appropriately added, a similar effect can be caused.

According to the preferred embodiments described above, the power semiconductor device includes the sealing material 8 formed covering the conductive metal plate 10B, the semiconductor element 1A, the semiconductor element 1B, and a part of the terminal 7B. According to such a configuration, insulation performance can be secured by the sealing material 8. This enables increase in reliability of the power semiconductor device.

According to the preferred embodiments described above, the metallic conductive material 9 is formed beyond a range where the conductive metal plate 10B and the terminal 7B overlap with each other in plan view. According to such a configuration, when the gap caused when the upper surface of the conductive metal plate 10B and the terminal 7B are bonded to each other is filled with the metallic conductive material 9, bonding with high stability without a gap can be formed.

According to the preferred embodiments described above, the plurality of the melted portions 11A is formed. According to such a configuration, when the plurality of the melted portions 11A is provided in a bonding portion between the terminal 7B and the conductive metal plate 10B, the bonded area between the terminal 7B and the conductive metal plate 10B can be further increased. The fiber laser has an irradiation range that is a relatively narrow range of several micrometers or more and several hundred micrometers or less, for example, so that forming the plurality of the melted portions 11A in one bonding portion to increase the bonded area is effective. This enables achieving not only highly reliable wiring connection by improving stability of bonding, but also long life of the power semiconductor device. Even when there is an abnormality of output of the fiber laser, an abnormality of input of heat, or the like, forming the plurality of the melted portions 11A suppresses unstable bonding.

According to the preferred embodiments described above, the power converter includes the conversion circuit 201 that includes the power semiconductor device described above, and converts input power and outputs the converted power, a drive circuit 202 that outputs a driving signal for driving the power semiconductor device to the power semiconductor device, and a control circuit 203 that outputs a control signal for controlling the drive circuit 202 to the drive circuit 202. According to such a configuration, the gap generated between the material to be bonded and the external terminal has a size of 20 μm or less due to the melted portion, so that variations in bonding strength can be suppressed. This enables increase in reliability of the power converter.

According to the preferred embodiments described above, in the method for manufacturing the power semiconductor device, the insulating substrate 3 provided at least on its upper surface with the circuit surface 3b is prepared. Then, the semiconductor element 1A is disposed on the upper surface of the circuit surface 3b with the bonding material 2 interposed therebetween. Subsequently, the terminal 7B is disposed on the upper surface of the circuit surface 3b, and the upper surface of the terminal 7B is irradiated with a fiber laser to bond the lower surface of the terminal 7B to the upper surface of the circuit surface 3b. Then, the upper surface of the circuit surface 3b is brought into contact with and bonded to a part of the lower surface of the terminal 7B. Subsequently, the melted portion 11 of the circuit surface 3b and the terminal 7B is formed in at least a part of a portion where the upper surface of the circuit surface 3b and the lower surface of the terminal 7B are in contact with each other. The gap generated between the upper surface of the circuit surface 3b and the lower surface of the terminal 7B has a size of 20 μm or less.

According to such a configuration, the gap generated between the circuit surface 3b and the terminal 7B has a size of 20 μm or less by forming the melted portion 11 using a fiber laser, so that variations in bonding strength can be suppressed. This enables increase in reliability of the power semiconductor device. While having a basic wavelength, the fiber laser can be expected to output high power with high energy density. Thus, using a fiber laser enables the melted portion 11 having a desirable penetration depth and bonded area to be formed. This enables highly reliable bonding having sufficient bonding strength to be formed. In addition, the fiber laser can be expected to output high power with high energy density, so that irradiation time of the laser for forming bonding can be set to a relatively short time of several tens of ms or more and several hundred ms or less, for example. This enables increasing production efficiency of the power semiconductor device to suppress manufacturing costs. In addition, around the bonding portion of the terminal in the power semiconductor device, there are scattered components to be destroyed by laser heat when being directly irradiated with light using a fiber laser, such as a semiconductor element, an insulating substrate, and a case made of a resin. Thus, irradiating directly only a terminal having desired heat capacity with a fiber laser enables not only forming a desired bonding shape (particularly a bonding shape having a desired penetration depth) by applying sufficient heat to the terminal, but also suppressing damage to the components scattered around a bonding portion of the terminal.

Other configurations other than those including examples described in the specification of the present application can be appropriately eliminated. That is, including at least these configurations can cause the effects described above.

However, even when at least one of the other configurations shown by way of example in the specification of the present application is appropriately added to the above-described configurations, i.e., even when the other configurations shown by way of example in the specification of the present application, which are not described as the configurations described above, is appropriately added, a similar effect can be caused.

When there is no particular restriction, the order in which each processing is performed can be changed.

According to the preferred embodiments described above, the terminal 7B is bonded to the upper surface of the circuit surface 3b by irradiating the upper surface of the terminal 7B with a fiber laser having a wavelength of 500 nm or more and 1200 nm or less. According to such a configuration, in the case where the terminal 7B is mainly composed of copper, the heat absorption rate of the terminal 7B can be efficiently increased without using Ni plating or the like for increasing a heat absorption rate. This enables not only manufacturing costs to be suppressed, but also a time required for a laser irradiation process to be shortened (e.g., about is or less).

According to the preferred embodiments described above, the conductive metal plate 10B is prepared in the method for manufacturing a power semiconductor device. Then, the semiconductor element 1A is disposed on the upper surface of the conductive metal plate 10B with the bonding material 2 interposed therebetween. Subsequently, the terminal 7B is disposed on the upper surface of the conductive metal plate 10B with the metallic conductive material 9 interposed therebetween, and the upper surface of the terminal 7B is irradiated with a fiber laser to bond the lower surface of the terminal 7B to the upper surface of the conductive metal plate 10B with the metallic conductive material 9 interposed therebetween. Then, the upper surface of the conductive metal plate 10B and the lower surface of the terminal 7B are in contact with each other with the metallic conductive material 9 interposed therebetween. Subsequently, the melted portion 11A of the conductive metal plate 10B, the terminal 7B, and the metallic conductive material 9 is formed in at least a part of a portion where the upper surface of the conductive metal plate 10B and the lower surface of the terminal 7B are in contact with each other. The metallic conductive material 9 has a thickness of 300 μm or less.

According to such a configuration, forming the melted portion 11A using a fiber laser causes the metallic conductive material 9 sandwiched between the upper surface of the conductive metal plate 10B and the terminal 7B to maintain the bonding strength, so that variations in bonding strength can be suppressed. This enables increase in reliability of the power semiconductor device. While having a basic wavelength, the fiber laser can be expected to output high power with high energy density. Thus, using a fiber laser enables the melted portion 11A having a desirable penetration depth and bonded area to be formed. This enables highly reliable bonding having sufficient bonding strength to be formed.

Other configurations other than those including examples described in the specification of the present application can be appropriately eliminated. That is, including at least these configurations can cause the effects described above.

However, even when at least one of the other configurations shown by way of example in the specification of the present application is appropriately added to the above-described configurations, i.e., even when the other configurations shown by way of example in the specification of the present application, which are not described as the configurations described above, is appropriately added, a similar effect can be caused.

When there is no particular restriction, the order in which each processing is performed can be changed.

According to the preferred embodiments described above, the lower surface of the terminal 7B is bonded to the upper surface of the conductive metal plate 10B with the metallic conductive material 9 interposed therebetween by irradiating the upper surface of the terminal 7B with a fiber laser having a wavelength of 500 nm or more and 1200 nm or less. According to such a configuration, in the case where the terminal 7B is mainly composed of copper, the heat absorption rate of the terminal 7B can be efficiently increased without using Ni plating or the like for increasing a heat absorption rate.

According to the preferred embodiments described above, in the method for manufacturing a power converter, there is provided the conversion circuit 201 that includes the power semiconductor device manufactured by the manufacturing method described above, and converts and outputs received electric power. Then, there is provided the drive circuit 202 that outputs a driving signal for driving the power semiconductor device to the power semiconductor device. Subsequently, there is provided the control circuit 203 that outputs a control signal for controlling the drive circuit 202 to the drive circuit 202. According to such a configuration, the melted portion can suppress variations in bonding strength. This enables increase in reliability of the power converter.

<Modifications in Preferred Embodiments Described Above>

While in the preferred embodiments described above, propertied of a material, a material, a dimension, a shape, a relative placement relationship, conditions of implementation, and the like of each component are described in some cases, these are each an example in all aspects, and are not limited to those described in the specification of the present application.

Accordingly, myriad variations and equivalents not illustrated in the examples are expected within the scope of the technique disclosed in the specification of the present application. This includes, for example, a case of modifying at least one component, a case of adding or eliminating a component, and a case of extracting at least one component in at least one preferred embodiment and combining it with a component of another preferred embodiment.

As long as no contradiction arises, it is assumed that the component described as being "one" in the preferred embodiments described above may include the "one or more" components.

Each component in the preferred embodiments described above is a conceptual unit, and the scope of the technique disclosed in the specification of the present application includes a case where one component is composed of a plurality of structures, a case where one component corresponds to a part of a certain structure, and a case where a plurality of components is provided in one structure.

In addition, each component in the preferred embodiments described above includes a structure having another structure or shape as long as the same function is exerted.

The description in the specification of the present application is referred to for all purposes relating to the present technique, and is not deemed to be prior art.

When a name of material, or the like is described without particular designation in the preferred embodiments described above, the material includes a material containing other additives in the material, such as an alloy, for example, as long as no contradiction arises.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a metal plate;
   a semiconductor element disposed on an upper surface of the metal plate via a bonding material; and
   an external terminal bonded to the upper surface of the metal plate,
   wherein
   the upper surface of the metal plate and a lower surface of the external terminal are in contact with each other via a conductive material,
   in at least a part of a portion where the upper surface of the metal plate and the lower surface of the external terminal are in contact with each other, a melted portion formed by melting the metal plate, the external terminal, and the conductive material at one time, and
   the metal plate and the external terminal are each made of copper or copper alloy.

2. The semiconductor device according to claim 1, further comprising a sealing material formed covering the metal plate, the semiconductor element, and a part of the external terminal.

3. The semiconductor device according to claim 1, wherein the conductive material is formed beyond a range where the metal plate and the external terminal overlap with each other in plan view.

4. The semiconductor device according to claim 1, wherein a plurality of the melted portions is formed.

5. A power converter comprising:
   a conversion circuit that converts received power and outputs the converted power, and includes a semiconductor device comprising:
   a metal plate;
   a semiconductor element disposed on an upper surface of the metal plate via a bonding material; and
   an external terminal bonded to the upper surface of the metal plate,
   wherein
   the upper surface of the metal plate and a lower surface of the external terminal are in contact with each other via a conductive material,
   in at least a part of a portion where the upper surface of the metal plate and the lower surface of the external terminal are in contact with each other, a melted portion of the metal plate, the external terminal, and the conductive material is formed, and
   the metal plate and the external terminal are each made of copper or copper alloy;
   a drive circuit that outputs a driving signal to the semiconductor device for driving the semiconductor device; and
   a control circuit that outputs a control signal to the drive circuit for controlling the drive circuit.

* * * * *